United States Patent
Tompkins et al.

(10) Patent No.: US 10,447,265 B1
(45) Date of Patent: Oct. 15, 2019

(54) HAND-HELD CONTROLLERS INCLUDING ELECTRICALLY CONDUCTIVE SPRINGS FOR HEAD-MOUNTED-DISPLAY SYSTEMS

(71) Applicant: FACEBOOK TECHNOLOGIES, LLC, Menlo Park, CA (US)

(72) Inventors: Glen Jason Tompkins, Woodinville, WA (US); Bradley Morris Johnson, Edmonds, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 89 days.

(21) Appl. No.: 15/616,554

(22) Filed: Jun. 7, 2017

(51) Int. Cl.
*H03K 17/975* (2006.01)
*H03K 17/96* (2006.01)
*G06F 3/02* (2006.01)
*G06F 1/16* (2006.01)

(52) U.S. Cl.
CPC .......... *H03K 17/975* (2013.01); *G06F 1/163* (2013.01); *G06F 1/1637* (2013.01); *G06F 3/0202* (2013.01); *H03K 17/962* (2013.01)

(58) Field of Classification Search
CPC ....... H03K 17/975; G06F 3/012; A63F 13/24; A63F 13/98; G02B 27/017
See application file for complete search history.

(56) References Cited

U.S. PATENT DOCUMENTS

| | | | | |
|---|---|---|---|---|
| 2009/0273890 | A1* | 11/2009 | Takagi | G06F 1/1616 361/679.01 |
| 2012/0326179 | A1* | 12/2012 | Kaitoh | G02B 26/0841 257/88 |
| 2013/0147610 | A1* | 6/2013 | Grant | A63F 13/285 340/12.5 |
| 2013/0245704 | A1* | 9/2013 | Koltz | A61B 17/00 606/86 A |
| 2016/0094881 | A1 | 3/2016 | Khatua | |
| 2016/0232715 | A1* | 8/2016 | Lee | G06T 19/006 |

* cited by examiner

*Primary Examiner* — Michael A Faragalla
*Assistant Examiner* — Chayce R Bibbee
(74) *Attorney, Agent, or Firm* — FisherBroyles, LLP

(57) ABSTRACT

A hand-held controller for a head-mounted-display system may include (1) a printed circuit board, (2) an electronic component that is separate from the printed circuit board, and (3) at least one conductive spring. The at least one conductive spring may include (1) a circuit-board connection portion electrically coupled to the printed circuit board and (2) a component connection portion electrically coupled to the electronic component. The at least one conductive spring may include an electrically conductive material that electrically couples the electronic component to the printed circuit board. Various other apparatuses, systems, and methods are also disclosed.

20 Claims, 12 Drawing Sheets

HAND-HELD CONTROLLERS INCLUDING ELECTRICALLY CONDUCTIVE SPRINGS FOR HEAD-MOUNTED-DISPLAY SYSTEMS

BACKGROUND

Putting on a virtual reality headset may be the beginning of a thrilling experience, one that may be more immersive than almost any other digital entertainment or simulation experience available today. Virtual reality headsets may enable users to travel through space and time, interact with friends in a three-dimensional world, or play video games in a radically redefined way. Virtual reality headsets may also be used for purposes other than recreation—governments may use them for military training simulations, doctors may use them to practice surgery, and engineers may use them as visualization aids.

Conventional virtual reality headset systems often include hand-held controllers that enable users to interact with virtual environments in a variety of ways. For example, users may manipulate hand-held controllers to send commands and positional information to virtual reality headset systems. These hand-held controllers may include various buttons, triggers, joysticks, and/or touchpads to receive user input. Additionally, information, such as haptic feedback, may be communicated to users via the hand-held controllers.

Recently, hand-held controllers have incorporated capacitive controls to enable a more diverse and immersive virtual experience. Hand-held controllers may, for example, incorporate capacitive electrodes into various input components, such as triggers and buttons. The capacitive electrodes may, for example, detect the presence and/or position of a user's fingers, allowing for a range of additional input options. Unfortunately, such capacitive electrodes must be disposed in close proximity to controller contact surfaces, requiring additional wiring, such as flex cables and/or zip connectors, to connect the capacitive electrodes to processing circuitry within the hand-held controllers. This additional wiring may add to the weight and complexity of the hand-held controllers and/or increase costs associated with manufacturing the hand-held controllers.

SUMMARY

As will be described in greater detail below, the instant disclosure generally relates to apparatuses, systems, and methods for hand-held controllers including electrically conductive springs for head-mounted displays. In one example, a hand-held controller may include (1) a printed circuit board, (2) an electronic component that is separate from the printed circuit board, and (3) at least one conductive spring. The at least one conductive spring may include (1) a circuit-board connection portion electrically coupled to the printed circuit board and (2) a component connection portion electrically coupled to the electronic component. The at least one conductive spring may include an electrically conductive material that electrically couples the electronic component to the printed circuit board.

According to some embodiments, the hand-held controller may further include a button housing and the electronic component may be disposed within the button housing. In this example, the button housing may be movable between an extended position and a depressed position and the circuit-board connection portion of the at least one conductive spring may be disposed closer to the component connection portion of the at least one conductive spring when the button housing is in the depressed position than when the button housing is in the extended position. The button housing may also be biased toward the extended position by the at least one conductive spring. The button housing may be rotatable about a pivot member. Additionally, the at least one conductive spring may further include a torsion spring having a coiled portion surrounding part of the pivot member. In some examples, the electronic component may include a capacitive electrode disposed along an inner surface portion of the button housing. The button housing may include an insulated wall adjacent the capacitive electrode.

In at least one embodiment, the at least one conductive spring may further include a torsion spring including (1) a coiled portion, (2) a circuit-board-side protruding portion extending between the coiled portion and the circuit board connection portion, and (3) a component-side protruding portion extending between the coiled portion and the component connection portion. The component connection portion may include an arcuate region that contacts an electrode surface of the electronic component. In this example, the arcuate region of the component connection portion may be slidable along the electrode surface. The hand-held controller may also include an insulated member disposed over a covered portion of the electrode surface, the insulating member defining a channel over an exposed portion of the electrode surface. The arcuate region of the component connection portion may be at least partially disposed within the channel. In some examples, the at least one conductive spring may include two conductive springs that are separated from each other by an insulated barrier. The at least one conductive spring may also be disposed between the printed circuit board and the electronic component.

Similarly, a system incorporating the above-described apparatus may include a head-mounted display and at least one hand-held controller including (1) a printed circuit board, (2) an electronic component that is separate from the printed circuit board, and (3) at least one conductive spring. The at least one conductive spring may include (1) a circuit-board connection portion electrically coupled to the printed circuit board, and (2) a component connection portion electrically coupled to the electronic component, the at least one conductive spring including an electrically conductive material that electrically couples the electronic component to the printed circuit board.

A corresponding method may include (1) electrically connecting a circuit-board connection portion of at least one conductive spring to a printed circuit board, the at least one conductive spring including an electrically conductive material, and (2) electrically connecting a component connection portion of the at least one conductive spring to an electronic component that is separate from the printed circuit board such that the at least one conductive spring electrically couples the electronic component to the printed circuit board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification.

Together with the following description, these drawings demonstrate and explain various principles of the instant disclosure.

Figure 1:
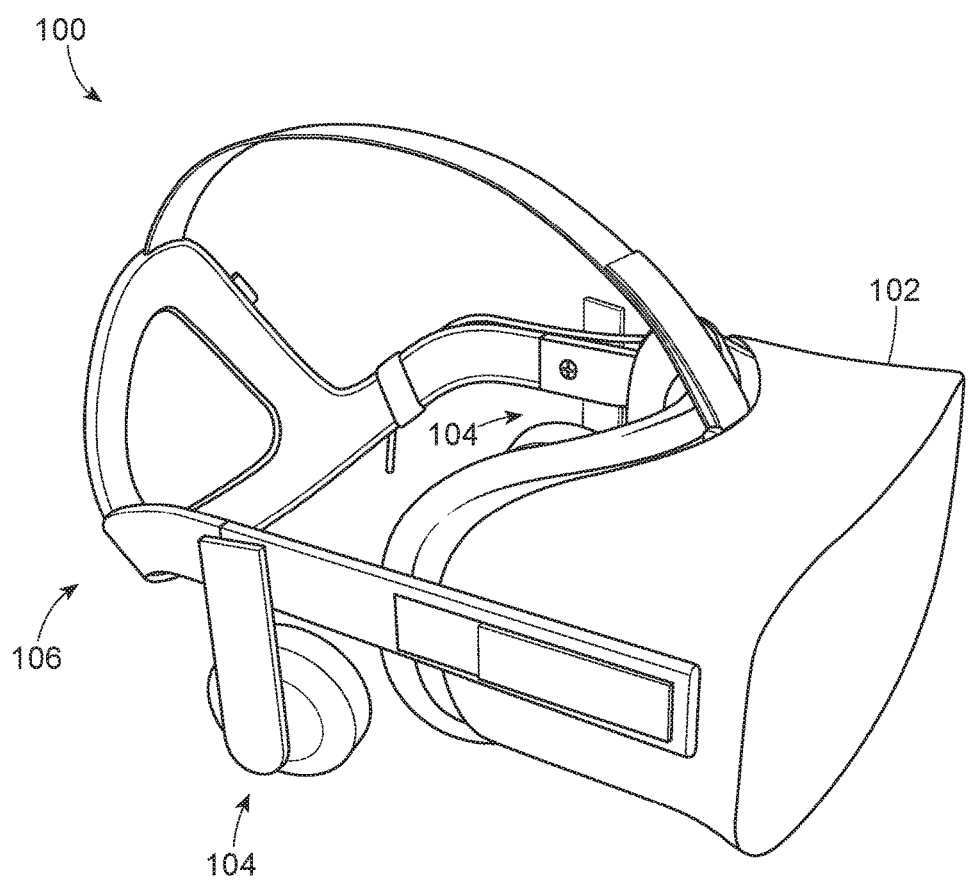
FIG. 1 is a perspective view of an exemplary head-mounted-display system.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for hand-held controllers including electrically conductive springs for head-mounted displays. As will be explained in greater detail below, embodiments of the instant disclosure may include hand-held controllers having one or more conductive springs for electrically coupling a printed circuit board (PCB) or other electronic element to an electronic component. For example, a conductive spring may be disposed between the PCB and an electronic component, such as a capacitive electrode and/or a haptic feedback element (e.g., a haptic motor), located within a button housing (e.g., a trigger housing) of a hand-held controller. The conductive spring may exert an outward force on the button housing, allowing the button housing to be depressed under an applied force from a user's hand and returning the button housing to an extended position when released by the user.

The conductive spring may also provide an electrical pathway between the PCB and the electronic component, thus eliminating the need to use additional electrical wiring to connect the PCB to the electronic component. Accordingly, the weight of the hand-held controller may be minimized by eliminating the need for additional electrical connectors. Additionally, the cost for manufacturing the hand-held controller may be minimized by reducing the number of parts required in the hand-held controller. The durability of the hand-held controller may also be increased by reducing the overall complexity and number of potential points of failure. As discussed in greater detail below, these and other disclosed embodiments, whether used alone or in combination, may help optimize the immersiveness, enjoyability, and/or utility of a virtual- or augmented-reality experience.

While the hand-held controller systems and methods are described herein in relation to head-mounted-display systems, such disclosed systems and methods may also be utilized in any other suitable controller device, without limitation, including, for example, controllers for video game and/or multimedia consoles, controllers for radio-controlled (RC) vehicles (e.g., RC cars, RC trucks, RC helicopters, RC boats, etc.), vehicular controllers, controllers for unmanned robotic vehicles (e.g., unmanned aerial vehicles, unmanned ground vehicles, unmanned surface vehicles, unmanned underwater vehicles, multirotor vehicles, unmanned spacecraft, etc.), computing device controllers, and/or any other suitable type of hand-held controller.

Reference will now be made to various exemplary embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known systems, methods, procedures, components, circuits, and networks have not been described in detail so as not to unnecessarily obscure aspects of the embodiments.

Figure 2:
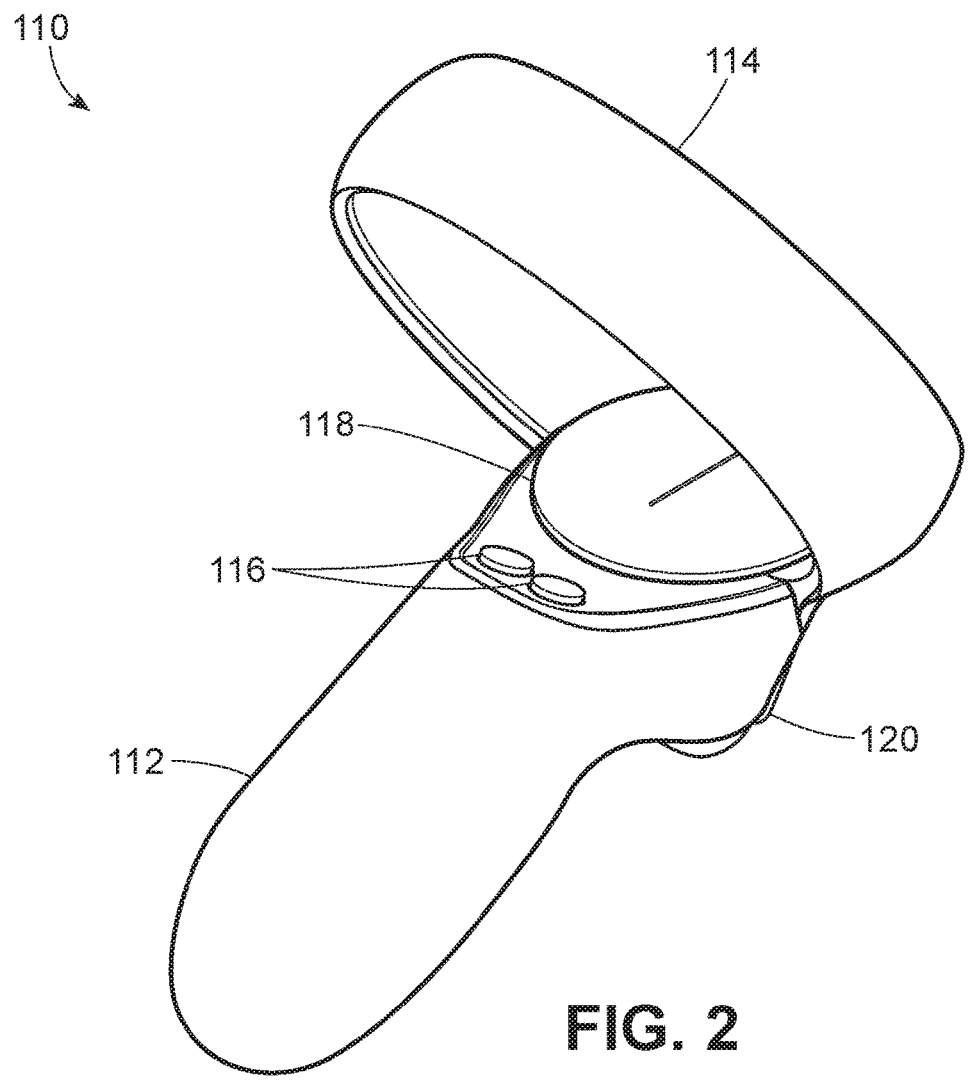
FIG. 2 is a perspective view of an exemplary hand-held controller for a head-mounted-display system.

The following will provide, with reference to FIGS. 1 and 2, examples of head-mounted-display systems that include hand-held controllers. In addition, the discussion corresponding to FIGS. 3-12 will provide examples of hand-held controllers and associated components. Finally, the discussion corresponding to FIG. 13 will provide examples of methods for assembling hand-held controllers.

FIG. 1 is a perspective view of a head-mounted-display system 100 in accordance with various embodiments. In some embodiments, head-mounted-display system 100 may include a head-mounted display 102, an audio subsystem 104 for each of a user's ears, and a strap assembly 106. Head-mounted-display system 100 may also include one or more hand-held controllers as will be discussed in greater detail below. The term "head-mounted display," as used herein, generally refers to any type or form of display device or system that is worn on or about a user's head and displays visual content to a user. Head-mounted displays may display content in any suitable manner, including via a screen (e.g., an LCD or LED screen), a projector, a cathode ray tube, an optical mixer, etc. Head-mounted displays may also display content in one or more of various media formats. For example, a head-mounted display may display video, photos, and/or computer-generated imagery (CGI).

Head-mounted displays may provide diverse and distinctive user experiences. Some head-mounted displays may provide virtual-reality experiences (i.e., they may display computer-generated or pre-recorded content), while other head-mounted displays may provide real-world experiences (i.e., they may display live imagery from the physical world). Head-mounted displays may also provide any mixture of live and virtual content. For example, virtual content may be projected onto the physical world (e.g., via optical or video see-through), which may result in augmented reality or mixed reality experiences. Head-mounted displays may be configured to be mounted to a user's head in a number of ways. Some head-mounted displays may be incorporated into glasses or visors. Other head-mounted displays may be incorporated into helmets, hats, or other headwear. Examples of head-mounted displays may include OCULUS RIFT, GOOGLE GLASS, VIVE, SAMSUNG GEAR, etc.

FIG. 2 is a perspective view of a hand-held controller 110 of head-mounted-display system 100 in accordance with various embodiments. Head-mounted-display system 100 may include at least one hand-held controller 110. For example, head-mounted-display system 100 may include two hand-held controllers 110, with one hand-held controller 110 for each of a user's right and left hands. Each hand-held controller 110 may be communicatively coupled to head-mounted display 102 and/or to a computing device (e.g., a personal computer, a console, etc.) communicatively coupled to head-mounted display 102. Hand-held controller 110 may be communicatively coupled to head-mounted display 102 via any suitable wireless and/or wired connection.

As shown in FIG. 2, hand-held controller 110 may include a grip 112 sized to fit within a user's right or left hand. Hand-held controller 110 may also include a tracking loop 114 for tracking position and orientation of hand-held controller 110. For example, tracking loop 114 may include an array of tracking lights, such as LEDs, that are used in conjunction with a sensor (not shown) for motion and positional tracking purposes to provide 360-degree motion control while using head-mounted-display system 100. Hand-held controller 110 may additionally include one or more input features (e.g., button, trigger, joystick, touchpad, etc.) for receiving input from a user. For example, hand-held controller 110 may include buttons 116 that may be depressed by the user's thumb to activate a corresponding switch and/or sensor. Additionally, hand-held controller 110 may include a touchpad 118 that includes, for example, sensors (e.g., capacitive sensors, conductive sensors, resistive sensors, etc.) that detect the position and/or directional movement of a user's thumb. In some embodiments, touchpad may be depressed by a user at one or more locations in the same manner as a button to provide additional input by activating one or more switches and/or sensors. Hand-held controller 110 may also include a trigger 120, which is a button that may be depressed by a user's finger (e.g., index finger) to activate a switch and/or sensor, on a side of hand-held controller 110 opposite buttons 116 and touchpad 118. Buttons 116, touchpad 118, and/or trigger 120 may additionally or alternatively include pressure-sensitive sensors (e.g., analog pressure-sensitive sensors) to detect pressure-specific input from a user. Additionally or alternatively, hand-held controller 110 may include one or more other buttons, triggers, touchpads, and/or any other suitable input features, such as, for example, an analog stick (e.g., thumbstick) and/or a control pad (e.g., directional pad), without limitation.

Figure 3:
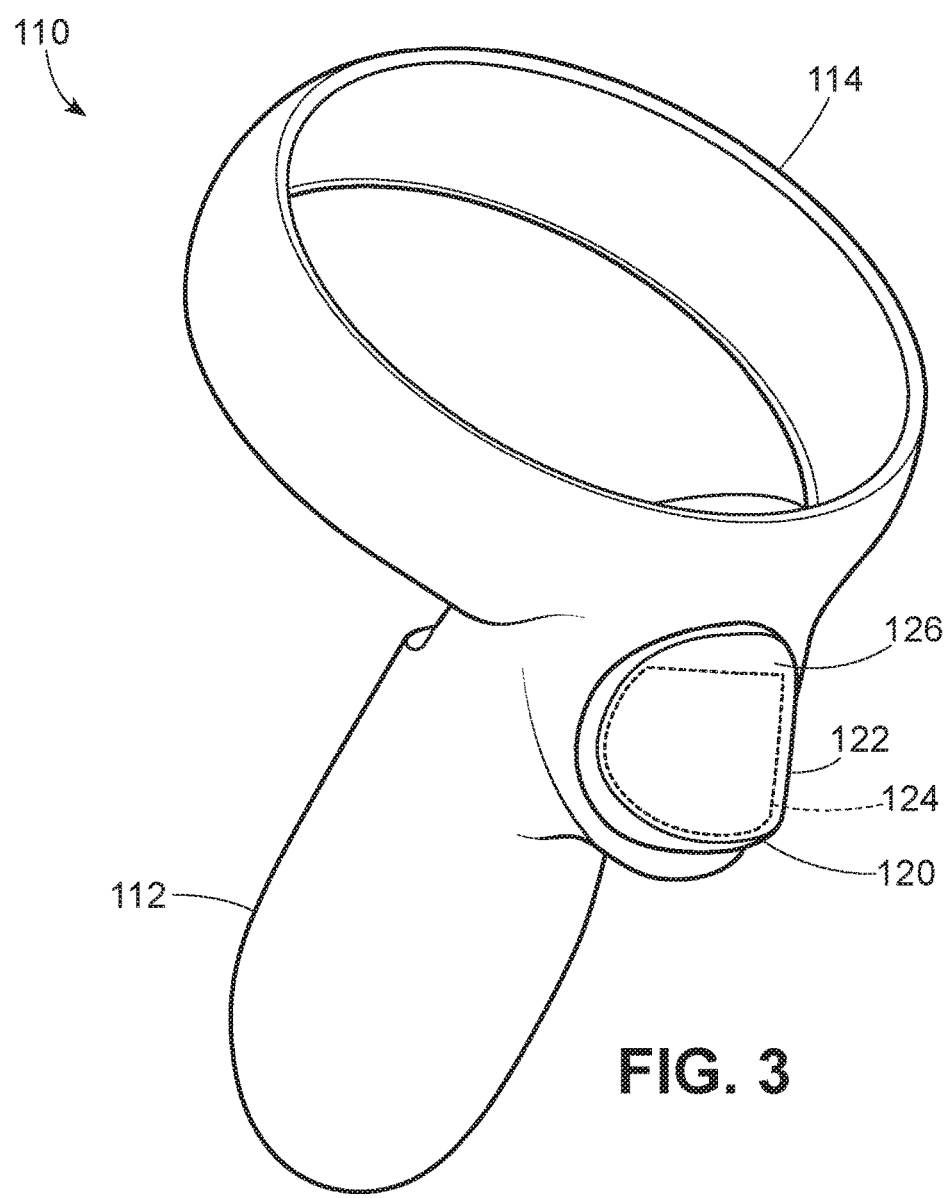
FIG. 3 is a perspective view of an exemplary hand-held controller for a head-mounted-display system.

FIG. 3 is a perspective view of hand-held controller 110 illustrating details of trigger 120. According to some embodiments, trigger 120, which may be a button positioned for interaction with a user's finger, such as the user's index finger, may include a trigger housing 122 surrounding at least one capacitive electrode. For example, as shown in FIG. 3, trigger 120 may include a capacitive electrode 124 within trigger housing 122. In some embodiments, trigger 120 may include any combination of two or more capacitive electrodes, as will be described in greater detail below (see, e.g., FIGS. 9 and 10).

Capacitive electrode 124 may be disposed adjacent to touch surface 126 of trigger housing 122. For example, capacitive electrode 124 may be disposed adjacent to and/or abutting an inner surface of trigger housing 122 overlapping touch surface 126. A voltage may be applied to capacitive electrode 124 by, for example, a PCB that is electrically connected to capacitive electrode 124. Capacitive electrode 124 may be utilized by hand-held controller 110 to sense the presence of a user's finger in close proximity to and/or contacting touch surface 126 based on a change in capacitance in capacitive electrode 124. Trigger housing 122 may include any suitable conductive and/or non-conductive material. In once example, trigger housing 122 may include an electrically non-conductive or substantially non-conductive material in a wall located between touch surface 126 and capacitive electrode 124. A user's finger may act as a dielectric, which alters an electric field surrounding capacitive electrode 124 and extending through trigger housing 122 to touch surface 126 and a region near touch surface 126. As the user's finger moves closer to touch surface 126, the effect on the electric field may be increased, thereby increasing the change in capacitance of capacitive electrode 124. Such capacitive sensing may enable various interactive options in a virtual environment. For example, a user may utilize certain gestures by placing a finger against touch surface 126 of trigger 120 or lifting a finger from touch surface 126. In some embodiments, capacitive electrode 124 may be enable a user to use a scrolling gesture by moving a finger across touch surface 126. One or more capacitive electrodes may additionally or alternatively be utilized in any other suitable portion of hand-held controller 110, without limitation, including, for example, one or more portions of grip 112, one or more of buttons 116, and/or touchpad 118.

Figure 4:
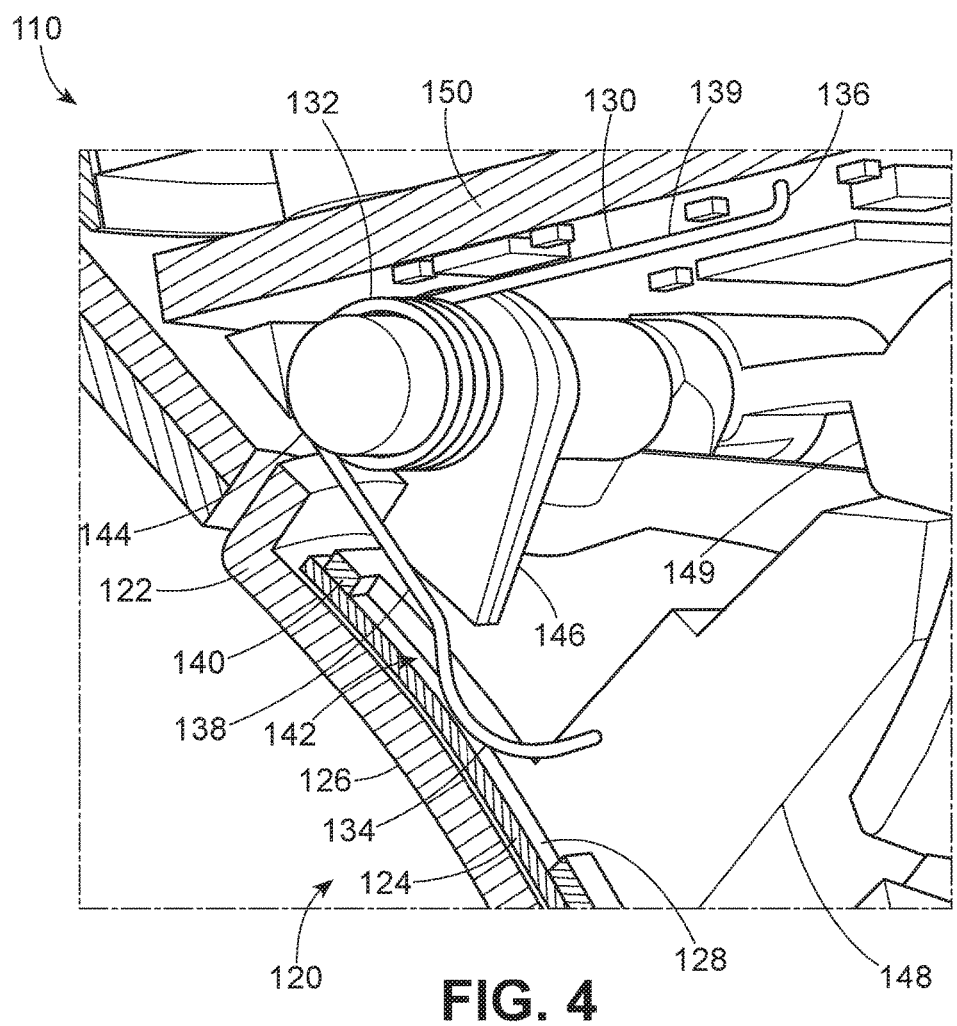
FIG. 4 is a cut-away perspective view of a portion of an exemplary hand-held controller for a head-mounted-display system.

FIG. 4 is a cut-away perspective view of a portion of hand-held controller 110 including trigger 120 and capacitive electrode 124. As shown in FIG. 4, hand-held controller 110 may include a conductive spring 130 positioned between trigger 120 and a PCB 150. Conductive spring 130 may be any suitable type of spring, without limitation. For example, conductive spring 130 may be a torsion spring as illustrated in FIG. 4. Conductive spring 130 may include any type of conductive material, without limitation, including, for example, a conductive metal or metal alloy. In one example, conductive spring 130 may be formed from music wire, which includes a cold drawn high-carbon steel alloy. In at least one example, conductive spring 130 may be plated with any suitable material. For example, conductive spring 130 may be coated with a zinc, silver, and/or nickel plating.

Conductive spring 130 may include a coiled portion 132 and two protruding portions extending in different directions respectively toward capacitive electrode 124 and PCB 150. For example, conductive spring 130 may include a component-side protruding portion 138 extending from coiled portion 132 toward capacitive electrode 124 and a circuit-board-side protruding portion 139 extending from coiled portion 132 toward PCB 150. A circuit-board connection portion 136 at a terminal end of circuit-board-side protruding portion 139 may be electrically coupled to PCB 150. Additionally, a component connection portion 134 at an end region of component-side protruding portion 138 may be electrically coupled to capacitive electrode 124.

PCB 150 may include one or more components for relaying power and/or signals to and/or from one or more other components of hand-held controller 110, such as, for example, buttons 116, touchpad 118, trigger 120, and/or any other component of hand-held controller 110. In some embodiments, PCB 150 may include at least one physical processor and/or may be electrically connected to at least one physical processor representing any type or form of hardware-implemented processing unit capable of interpreting and/or executing computer-readable instructions. Examples of such a physical processor include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, and/or any other suitable physical processor. Additionally or alternatively, PCB 150 may include any other suitable electronic components utilized in the operation of hand-held controller 110, without limitation.

In some embodiments, trigger 120 may include an insulating member 140 disposed over at least a portion of capacitive electrode 124. For example, as shown in FIG. 4, insulating member 140 may cover at least a portion of a contact surface 128 of capacitive electrode 124 such that a covered portion of capacitive electrode 124 is disposed between insulating member 140 and trigger housing 122. Insulating member 140 may include an insulating material having little or no electrical conductivity. A channel 142 may be defined in insulating member 140 so that a portion of contact surface 128 of capacitive electrode 124 is exposed to component connection portion 134 of conductive spring 130. In at least one embodiment, at least a portion of component connection portion 134 may be disposed within channel 142. For example, as illustrated in FIG. 4, component connection portion 134 may abut contact surface 128 of capacitive electrode 124 within channel 142.

In some examples, component connection portion 134 of conductive spring 130 may have an arcuate shape that convexly curves toward contact surface 128 of capacitive electrode 124 from component-side protruding portion 138. In this example, a terminal portion of conductive spring 130 may curve away from contact surface 128 of capacitive electrode 124 such that the terminal portion of conductive spring 130 extends away from contact surface 128 and/or protrudes from channel 142. Coiled portion 132 of conductive spring 130 may be under tension between PCB 150 and trigger 120 so that component connection portion 134 is forced against contact surface 128 of capacitive electrode 124, thereby maintaining an electrical coupling between component connection portion 134 and capacitive electrode 124. In at least one example, component connection portion 134 of conductive spring 130 may be slidable along contact surface 128 of capacitive electrode 124 as trigger 120 is moved from an extended position to a depressed position.

According to at least one embodiment, trigger 120 may be rotatable about a pivot member 144. For example, trigger 120 may include a pivot connector 146 at least partially surrounding pivot member 144. In some examples, pivot member 144 may have an elongated and substantially cylindrical shape. For example, pivot member 144 may be a pivot pin, such as a metal pivot pin, that extends through a corresponding through-hole defined in pivot connector 146. Pivot member 144 may also extend into a corresponding hole or recess defined in a pivot mounting portion of hand-held controller 110 that is separate from trigger 120. In some embodiments, as shown in FIG. 4, coiled portion 132 of conductive spring 130 may also surround a portion of pivot member 144. Pivot member 144 may at least partially secure conductive spring 130, preventing undesired movement of conductive spring 130 within hand-held controller 110. For example, as conductive spring 130 is compressed between trigger 120 and another portion of hand-held controller 110, coiled portion 132 may be held in place by pivot member 144 as component-side protruding portion 138 is moved toward circuit-board-side protruding portion 139. In some examples, an insulating layer may be disposed around at least a portion of pivot member 144 such that the insulating layer is positioned between pivot member 144 and coiled portion 132 of conductive spring 130, preventing an electrical connection between conductive spring 130 and pivot member 144.

Pivot connector 146 may be connected to at least a portion of trigger 120. For example, pivot connector may 146 be connected to, and may extend from, at least a portion of trigger housing 122. As will be described in greater detail below, trigger 120 may pivot about pivot member 144 between an extended position when no external force is applied to trigger 120 and a depressed position when an external force is applied to trigger 120 by, for example, a user's finger. In some embodiments, pivot connector 146 may include an insulating material having little or no electrical conductivity. In some examples, trigger 120 may include a switch activation member 148 that activates a switch mechanism 149 (e.g., a switch mechanism that includes a switch and/or a sensor) when trigger 120 is in the depressed position. For example, switch activation member 148 may include a protrusion that contacts switch mechanism 149 and/or interacts with a sensor to register user input when trigger 120 is depressed by the user.

Trigger housing 122, insulating member 140, pivot connector 146, and switch activation member 148 may be formed of any suitable material, without limitation. In some embodiments, trigger housing 122, insulating member 140, pivot connector 146, and/or switch activation member 148 may include insulating materials having little or no electrical conductivity so as to prevent these parts from conducting electrical current from conductive spring 130 and/or capacitive electrode 124. Accordingly, in at least one example, conductive spring 130 may be utilized in trigger 120 without an insulative coating. Trigger housing 122, insulating member 140, pivot connector 146, and/or switch activation member 148 may, for example, be formed of a plastic material, such as a hard plastic material, including, without limitation, high density polyethylene (HDPE), acrylonitrile butadiene styrene (ABS) and/or polycarbonate (e.g., PC-ABS). In some embodiments, at least a portion of conductive spring 130 may be coated with an insulative layer.

Figure 5:
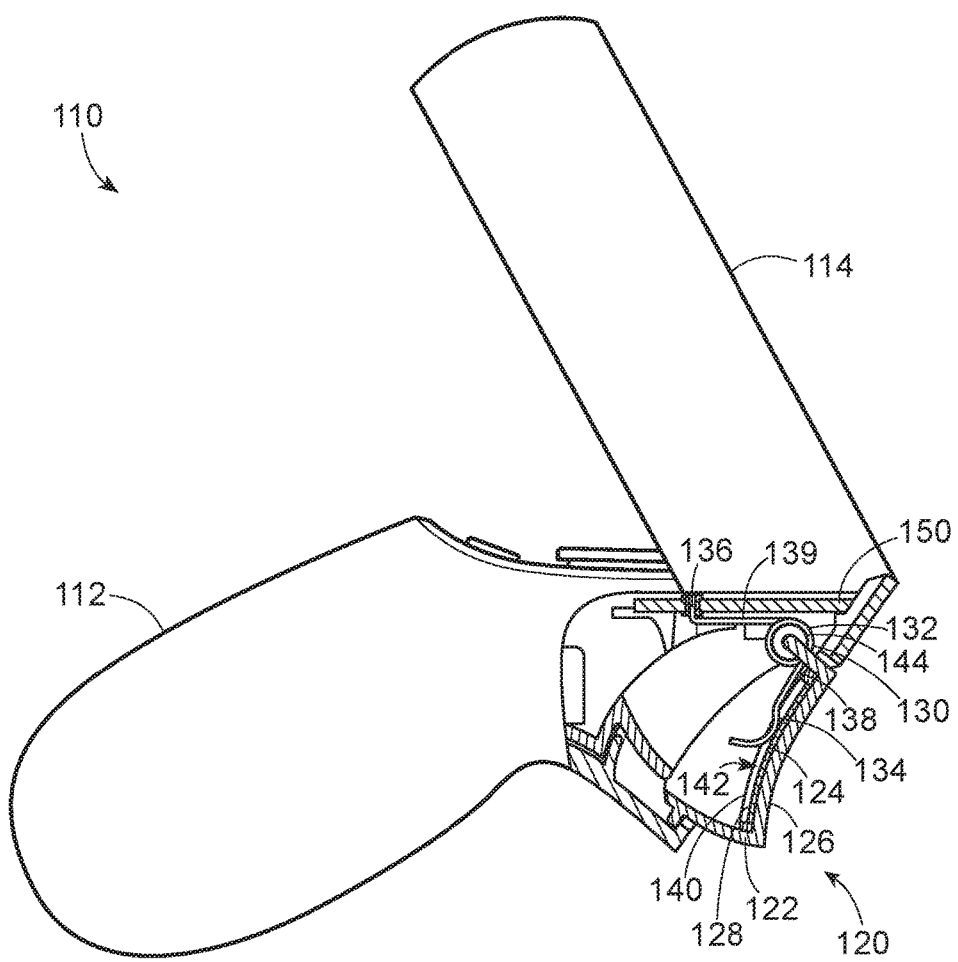
FIG. 5 is a cut-away side view of an exemplary hand-held controller for a head-mounted-display system.
Figure 6:
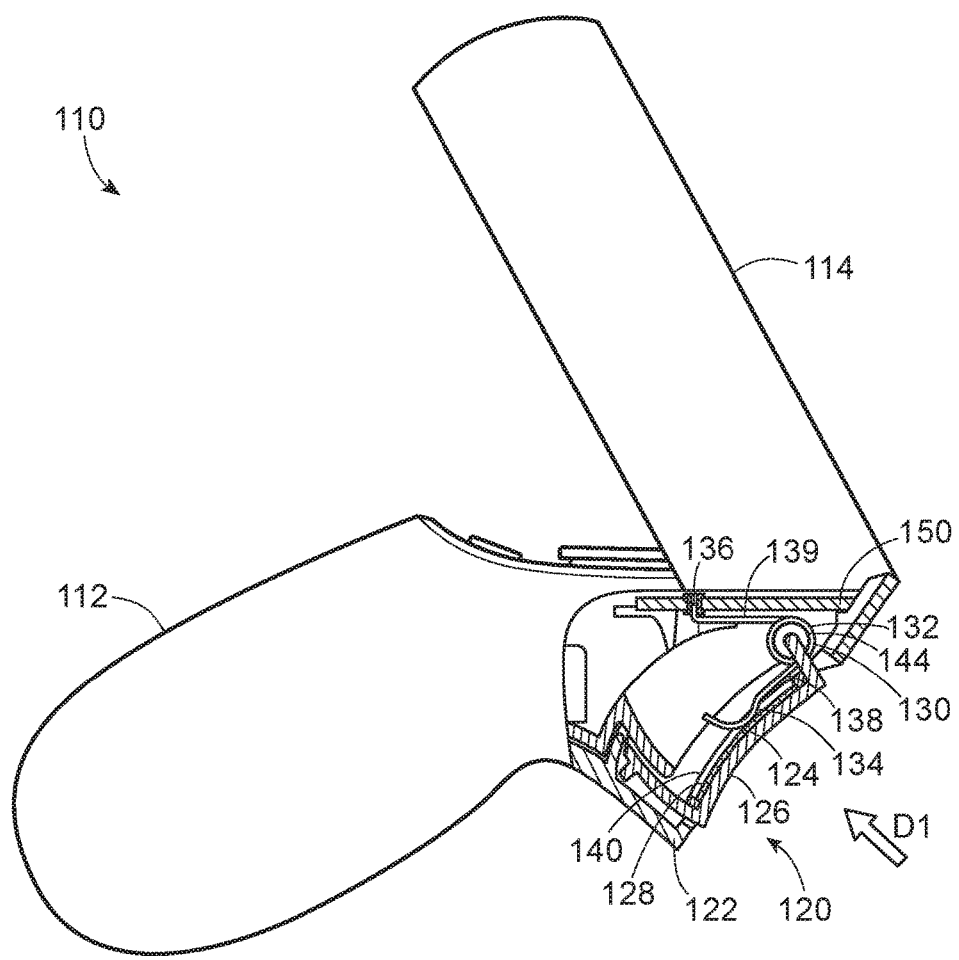
FIG. 6 is a cut-away side view of an exemplary hand-held controller for a head-mounted-display system.

FIGS. 5 and 6 are a cut-away side views of hand-held controller 110 respectively showing trigger 120 in an extended position and a depressed position. As shown in these figures, trigger 120 may be moved from the extended position illustrated in FIG. 5 to the depressed position illustrated in FIG. 6 when a force is applied to trigger 120 generally in direction D1 by, for example, a user's finger.

In some embodiments, in the absence of an external force, trigger 120 may be maintained in the extended position shown in FIG. 5 by a force applied by conductive spring 130 to trigger 120. For example, conductive spring 130 may be disposed within hand-held controller 110 in a partially compressed state in which component-side protruding portion 138 of conductive spring 130 is in closer proximity circuit-board-side protruding portion 139 than when conductive spring 130 is in an uncompressed state. As a sufficient force is applied to trigger 120 by a user's finger generally in direction D1, the force applied by conductive spring 130 to trigger 120 may be overcome by the force of the user's finger and trigger 120 may move toward the depressed position shown in FIG. 6. Trigger 120 may rotate about pivot member 144 and pivot member 144 may hold coiled portion 132 of conductive spring 130 in place. When trigger 120 is in the depressed position, conductive spring 130 may be further compressed between trigger 120 and another portion of hand-held controller 110, such as PCB 150, such that component-side protruding portion 138 of conductive spring 130 is in closer proximity circuit-board-side protruding portion 139 than when trigger 120 is in the extended position. Additionally, as trigger 120 is brought into the depressed position from the extended position, switch activation member 148 may contact and/or otherwise activate a trigger switch and/or sensor, such as switch mechanism 149 (see, e.g., FIG. 4).

According to at least one embodiment, conductive spring 130 may not be bonded or otherwise directly attached to capacitive electrode 124. Conductive spring 130 may exert a force against capacitive electrode 124 so that component connection portion 134 of conductive spring 130 is forced against contact surface 128 of capacitive electrode 124, maintaining an electrical coupling between conductive spring 130 and capacitive electrode 124 when trigger 120 is in the extended position and in the depressed position. In some embodiments, component connection portion 134 of conductive spring 130, which has an arcuate shape abutting contact surface 128 of capacitive electrode 124, may slide along at least a portion of contact surface 128 as trigger 120 moves between the extended position and the depressed position. For example, the arcuate shape of component connection portion 134 of conductive spring 130 may enable component connection portion 134 to slide along contact surface 128 of capacitive electrode 124 within channel 142 defined in insulating member 140 such that component connection portion 134 remains in contact with contact surface 128 while trigger 120 is in the extended position, the depressed position, and any position therebetween. The arcuate shape of component connection portion 134 of conductive spring 130 may also enable component connection portion 134 to slide along contact surface 128 without catching on a portion of capacitive electrode 124 and/or insulating member 140 during movement.

Figure 7:
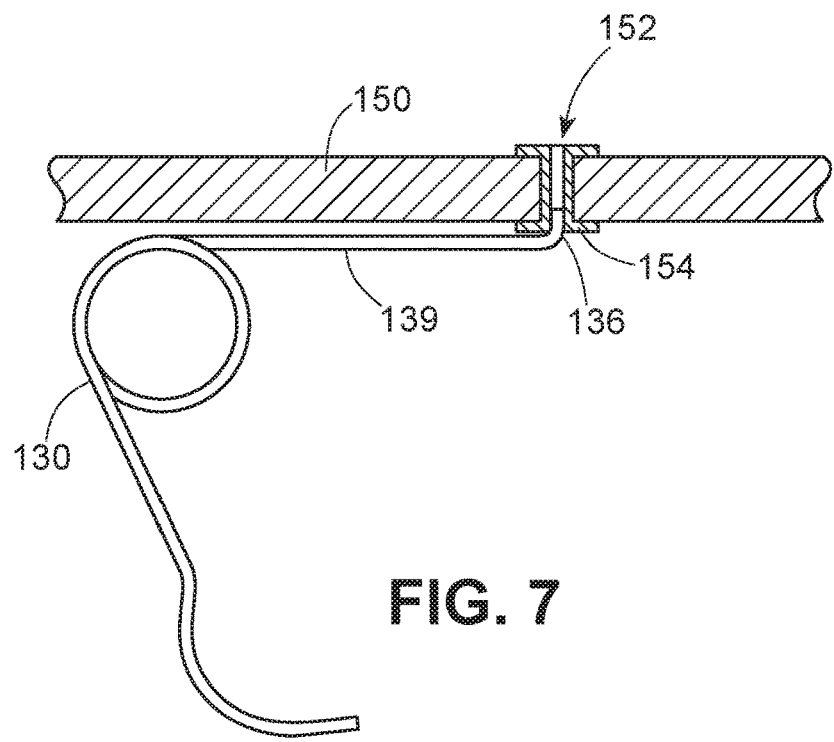
FIG. 7 is a cross-sectional side view of a conductive spring and a printed circuit board.
Figure 8:
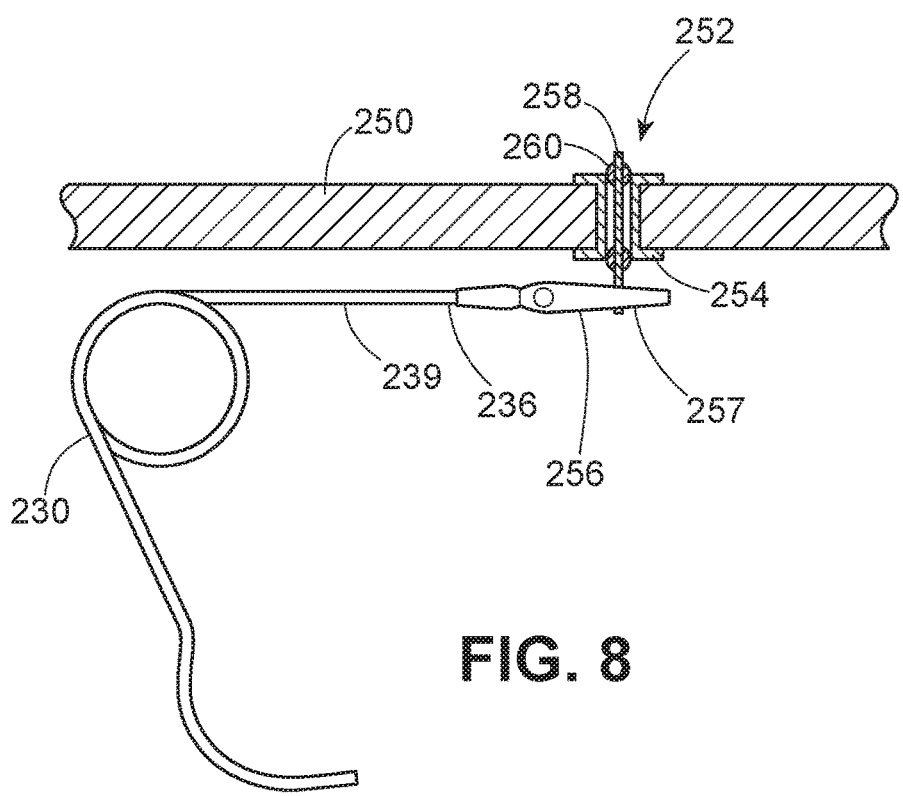
FIG. 8 is a cross-sectional side view of a conductive spring and a printed circuit board.

FIGS. 7 and 8 illustrate conductive springs electrically coupled to PCBs in various ways. As shown in FIG. 7, for example, circuit-board connection portion 136 of conductive spring 130 may be inserted into a connection opening, such as a through-hole or via, defined in PCB 150. In at least one embodiment, connection portion 136 may be bent relative circuit-board-side protruding portion 139 of conductive spring 130 and may extend in a direction toward PCB 150. As shown in FIG. 7, connection portion 136 may be inserted into a plated via 152 defined in PCB 150. Plated via 152 may be plated with a conductive plating 154 that includes any suitable conductive material, without limitation. In at least one example, connection portion 136 of conductive spring 130 may be soldered to plated via 152 and/or an adjacent portion of PCB 150 following insertion of connection portion 136 into plated via 152.

In some embodiments, as shown in FIG. 8, a conductive spring may be electrically coupled to a PCB by a clip or other suitable fastener. As illustrated in FIG. 8, conductive spring 230 may be fastened to a suitable connection portion of PCB 250. For example, circuit-board connection portion 236 of conductive spring 230 may be attached to an electrically conductive fastener 256, such as an electrostatic discharge (ESD) clip (e.g., an alligator clip) and/or any other suitable fastener. Fastener 256 may securely fasten conductive spring 230 to at least a portion of PCB 250 such that conductive spring 230 is electrically connected to PCB 250. For example, as shown in FIG. 8, fastener 256 may be clipped to a post 258 extending from PCB 250. Post 258 may extend through at least a portion of PCB 250, such as a plated via 252 defined in PCB 250. Post 258 may be electrically connected and secured to plated via 252 by at least one solder 260.

Figure 9:
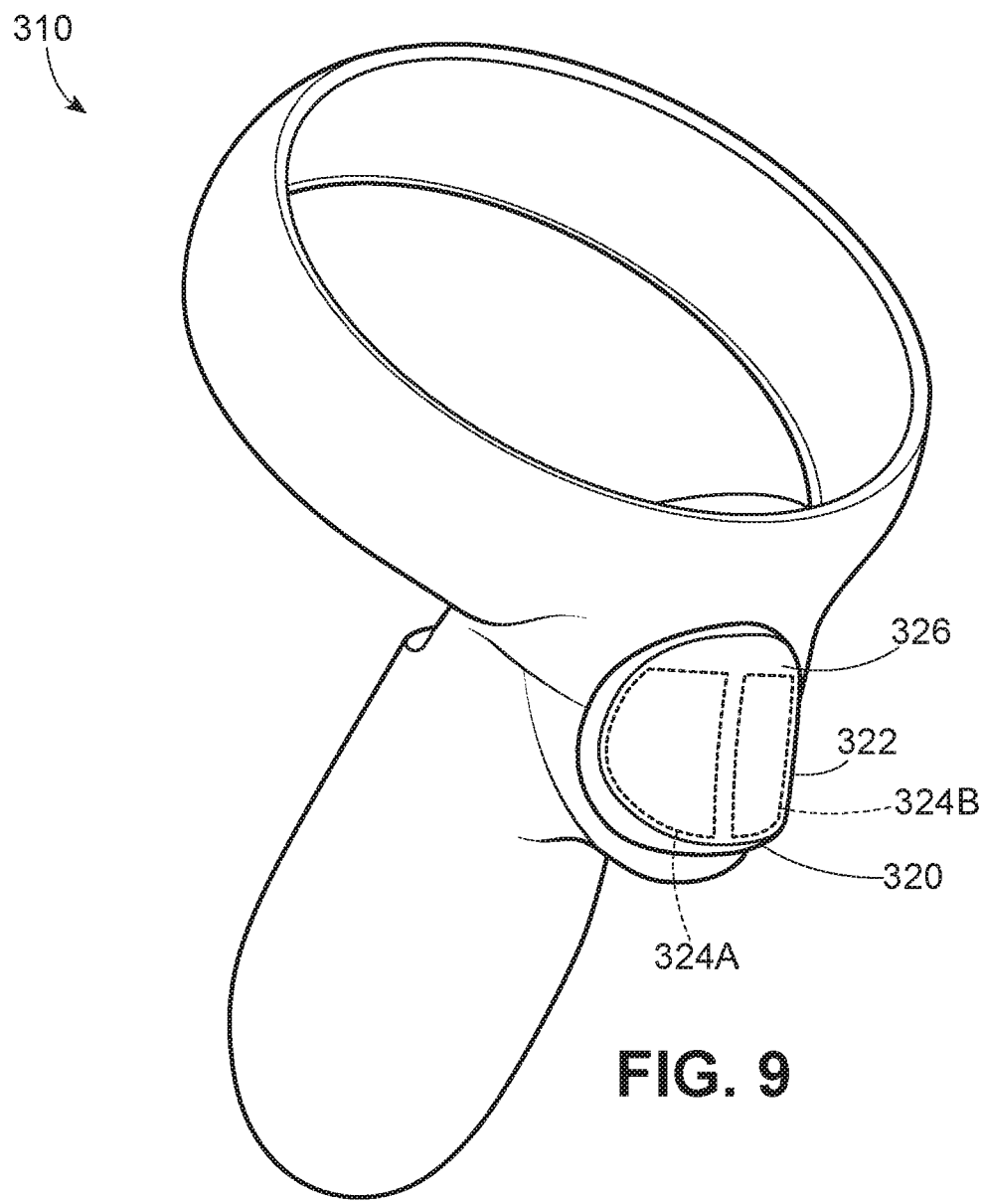
FIG. 9 is a perspective view of an exemplary hand-held controller for a head-mounted-display system.

FIG. 9 is a perspective view of a hand-held controller 310 for a head-mounted-display system, such as head-mounted-display system 100 illustrated in FIG. 1, in accordance with some embodiments. According to at least one embodiment, hand-held controller 310 may include a trigger 320 having a trigger housing 322 surrounding a plurality of capacitive electrodes. For example, as shown in FIG. 3, trigger 320 may include capacitive electrodes 324A and 324B (e.g., right and left capacitive electrodes). In some embodiments, trigger 320 may include any combination of two or more capacitive electrodes (e.g., upper and lower capacitive electrodes, etc.).

Capacitive electrodes 324A and 324B may be disposed adjacent to and/or abutting an inner surface of trigger housing 322 overlapping touch surface 326. As will be described in greater detail below, a voltage may be applied to each of capacitive electrodes 324A and 324B. In some examples, a separate voltage may be applied to each of capacitive electrode 324A and capacitive electrode 324B. In at least one example, the same voltage may be applied to both capacitive electrode 324A and capacitive electrode 324B. For example, capacitive electrode 324A and capacitive electrode 324B may both be connected to a common voltage source. Capacitive electrode 324A and/or 324B may sense the presence of a user's finger in close proximity to and/or contacting touch surface 326 based on a change in capacitance. Such capacitive sensing may enable various interactive options in a virtual environment. For example, a user may utilize certain gestures by lifting a finger from touch surface 326 of trigger 320 or returning a finger to touch surface 326.

In some embodiments, capacitive electrodes 324A and 324B may be used in combination to enable a user to use additional gestures. For example, capacitive electrodes 324A and 324B may allow a user to utilize a scrolling gesture by moving a finger across touch surface 326. For example, a finger movement across touch surface 326 from a region adjacent to capacitive electrode 324A to a region adjacent to capacitive electrode 324B may signal a right-to-left or up-down scrolling gesture, and a finger movement in the opposite direction across touch surface 326 may signal a left-to-right or down-up scrolling gesture.

Figure 10:
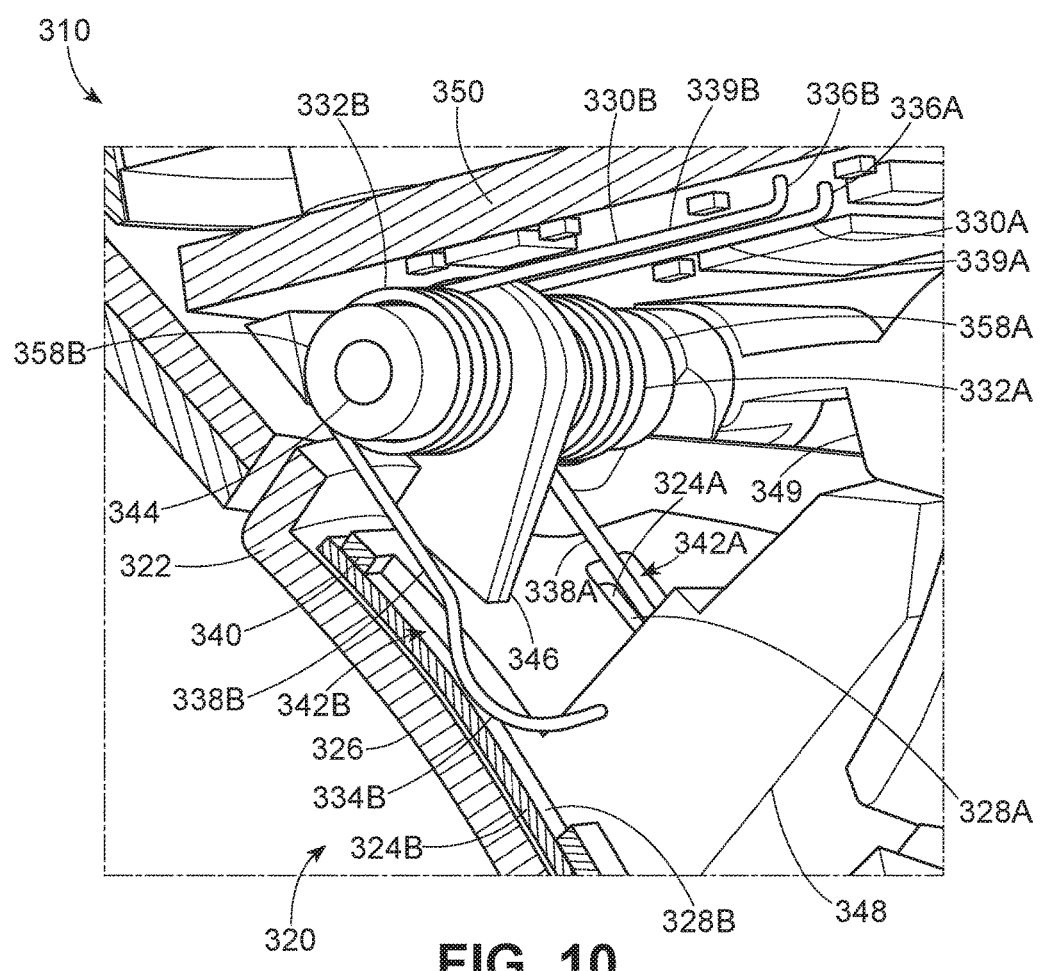
FIG. 10 is a cut-away perspective view of a portion of an exemplary hand-held controller for a head-mounted-display system.

FIG. 10 is a cut-away perspective view of a portion of hand-held controller 310 including trigger 320 and capacitive electrodes 324A and 324B. As shown in FIG. 10, hand-held controller 310 may include a plurality of conductive springs positioned between trigger 320 and a PCB 350. For example, trigger 320 of hand-held controller 310 may include a conductive spring 330A and a conductive spring 330B. Conductive springs 330A and 330B may each be any suitable type of electrically conductive spring, without limitation. For example, conductive springs 330A and 330B may be torsion springs as illustrated in FIG. 10. Conductive springs 330A and 330B may each include any type of conductive material, without limitation, including, for example, a conductive metal or metal alloy, as described in greater detail above in reference to FIG. 4.

Conductive springs 330A and 330B may respectively include coiled portions 332A and 332B and protruding portions extending in different directions toward capacitive electrodes 324A and 324B and PCB 350. For example, conductive springs 330A and 330B may include component-side protruding portions 338A and 338B respectively extending from coiled portions 332A and 332B toward capacitive electrodes 324A and 324B. Conductive springs 330A and 330B may also include circuit-board-side protruding portions 339A and 339B respectively extending from coiled portions 332A and 332B toward PCB 350. Circuit-board connection portions 336A and 336B at corresponding terminal ends of circuit-board-side protruding portions 339A and 339B may be electrically coupled to PCB 350. Additionally, component connection portions 334A and 334B at end regions of component-side protruding portions 338A and 338B may be respectively electrically coupled to capacitive electrodes 324A and 324B.

In some embodiments, trigger 320 may include an insulating member 340 disposed over at least a portion of capacitive electrodes 324A and 324B. For example, as shown in FIG. 10, insulating member 340 may cover at least a portion of contact surfaces 328A and 328B of corresponding capacitive electrodes 324A and 324B such that capacitive electrodes 324A and 324B are each disposed between insulating member 340 and trigger housing 322. Channels 342A and 342B may be defined in insulating member 340 so that a portion of each of contact surface 328A of capacitive electrode 324A and contact surface 328B of capacitive electrode 324B is respectively exposed to component connection portion 334A of conductive spring 330A and component connection portion 334B of conductive spring 330B. In at least one embodiment, at least a portion of component connection portion 334A of conductive spring 330A may be disposed within channel 342A and at least a portion of component connection portion 334B of conductive spring 330B may be disposed within channel 342B. For example, as illustrated in FIG. 10, component connection portion 334A may abut contact surface 328A of capacitive electrode 324A within channel 342A and component connection portion 334B may abut contact surface 328B of capacitive electrode 324B within channel 342B. In some examples, component connection portions 334A and 334B may each have an arcuate shape. Coiled portions 332A and 332B of conductive springs 330A and 330B may be under tension between PCB 350 and trigger 320 so that component connection portions 334A and 334B are forced against respective contact surfaces 328A and 328B, thereby maintaining an electrical coupling between component connection portions 334A and 334B and corresponding capacitive electrodes 324A and 324B.

According to at least one embodiment, trigger 320 may be rotatable about a pivot member 344. For example, trigger 320 may include a pivot connector 346 at least partially surrounding pivot member 344. In some examples, pivot member 344 may have an elongated and substantially cylindrical shape. For example, pivot member 344 may be a pivot pin, such as a metal pivot pin, that extends through a corresponding through-hole defined in pivot connector 346. Pivot member 344 may also extend into a corresponding hole or recess defined in a pivot mounting portion of hand-held controller 310 that is separate from trigger 320. In some embodiments, as shown in FIG. 10, coiled portions 332A and 332B of conductive springs 330A and 330B may also surround a portion of pivot member 344. In some examples, as shown in FIG. 10, insulating layers 358A and 358B may be disposed around at least a portion of pivot member 344 such that insulating layers 358A and 358B are respectively positioned between pivot member 344 and coiled portions 332A and 332B, preventing an electrical connection between conductive springs 330A and 330B and pivot member 344. In at least one example, pivot connector 346 may be formed of an electrically insulative material that prevents an electrical connection between conductive spring 330A and conductive spring 330B.

Pivot connector 346 may be connected to at least a portion of trigger 320. For example, pivot connector may 346 be connected to at least a portion of trigger housing 322. Trigger 320 may pivot about pivot member 344 between an extended position when no external force is applied to trigger 320 and a depressed position when an external force is applied to trigger 320 by, for example, a user's finger. In some examples, trigger 320 may include a switch activation member 348 that activates a switch mechanism 349 (e.g., a switch mechanism that includes a switch and/or a sensor) when trigger 320 is in the depressed position. For example, switch activation member 348 may include a protrusion that contacts switch mechanism 349 and/or interacts with a sensor to register user input when trigger 320 is depressed by the user.

Trigger housing 322, insulating member 340, pivot connector 346, and switch activation member 348 may be formed of any suitable material, without limitation. In some embodiments, trigger housing 322, insulating member 340, pivot connector 346, and/or switch activation member 348 may be include insulating materials having little or no electrical conductivity to prevent these parts from conducting electrical current from conductive springs 330A and 330B and/or capacitive electrodes 324A and 324B. Accordingly, in at least one example, conductive spring 330A and/or 330B may be utilized in trigger 320 without an insulative coating. Trigger housing 322, insulating member 340, pivot connector 346, and/or switch activation member 348 may, for example, include a plastic material, such as a hard plastic material, including, without limitation, high density polyethylene (HDPE), acrylonitrile butadiene styrene (ABS) and/or polycarbonate (e.g., PC-ABS).

Figure 11:
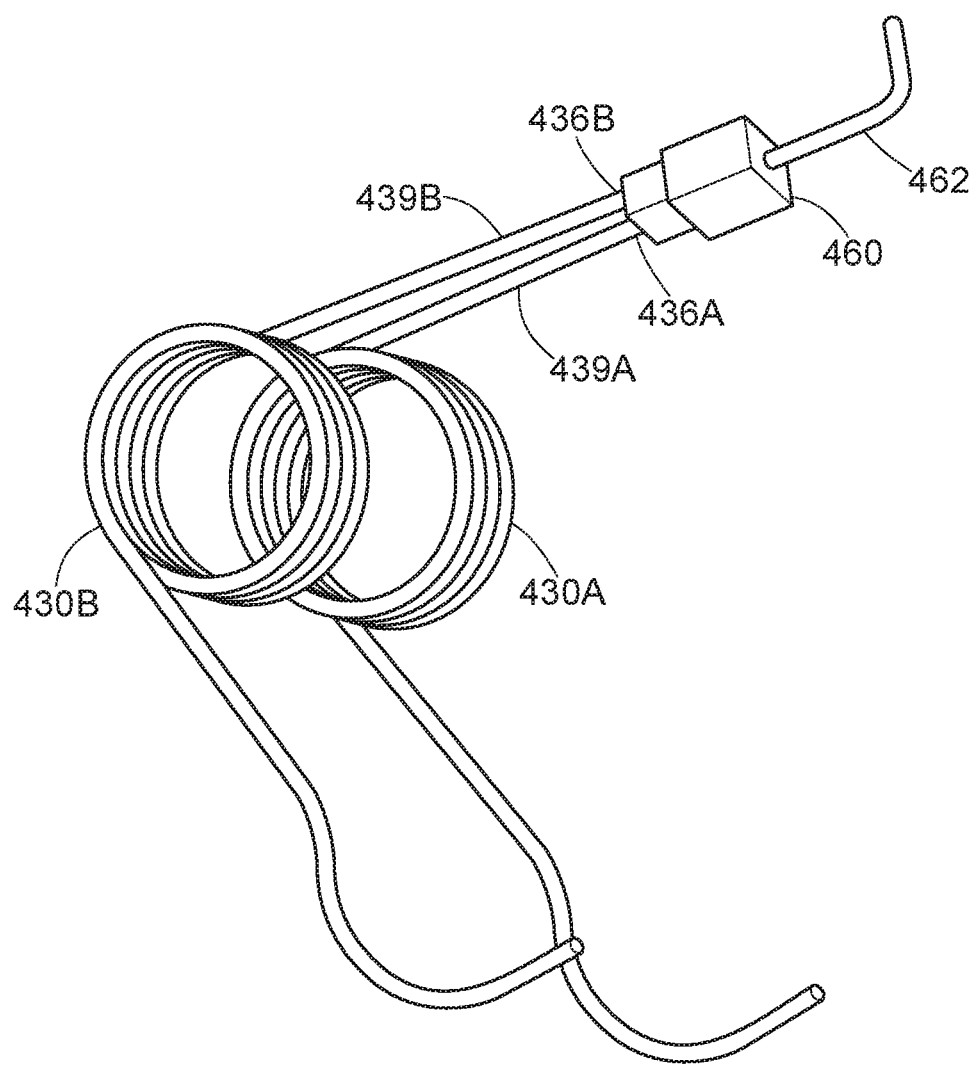
FIG. 11 is a perspective view of two conductive springs connected to an electrical connector.

FIG. 11 illustrates two conductive springs 430A and 430B connected to an electrical connector. According to some embodiments, a hand-held controller (e.g., hand-held controller 310 shown in FIGS. 9 and 10) may include a plurality of conductive springs that are connected to each other via an electrical connector. For example, as shown in FIG. 11, conductive springs 430A and 430B may be electrically coupled via a bridge connector 460. Conductive spring 430A may, for example, have a circuit-board connection portion 436A at an end of a circuit-board-side protruding portion 439A that is electrically coupled to bridge connector 460. Additionally, conductive spring 430B may have a circuit-board connection portion 436B at an end of a circuit-board-side protruding portion 439B that is also electrically coupled to bridge connector 460, thereby electrically connecting conductive spring 430A to conductive spring 430B. A connection wire 462 or any other suitable connection terminal may extend from bridge connector 460. Connection wire 462 may be electrically coupled to a PCB in any suitable manner as disclosed herein (see, e.g., FIGS. 7 and 8).

Figure 12:
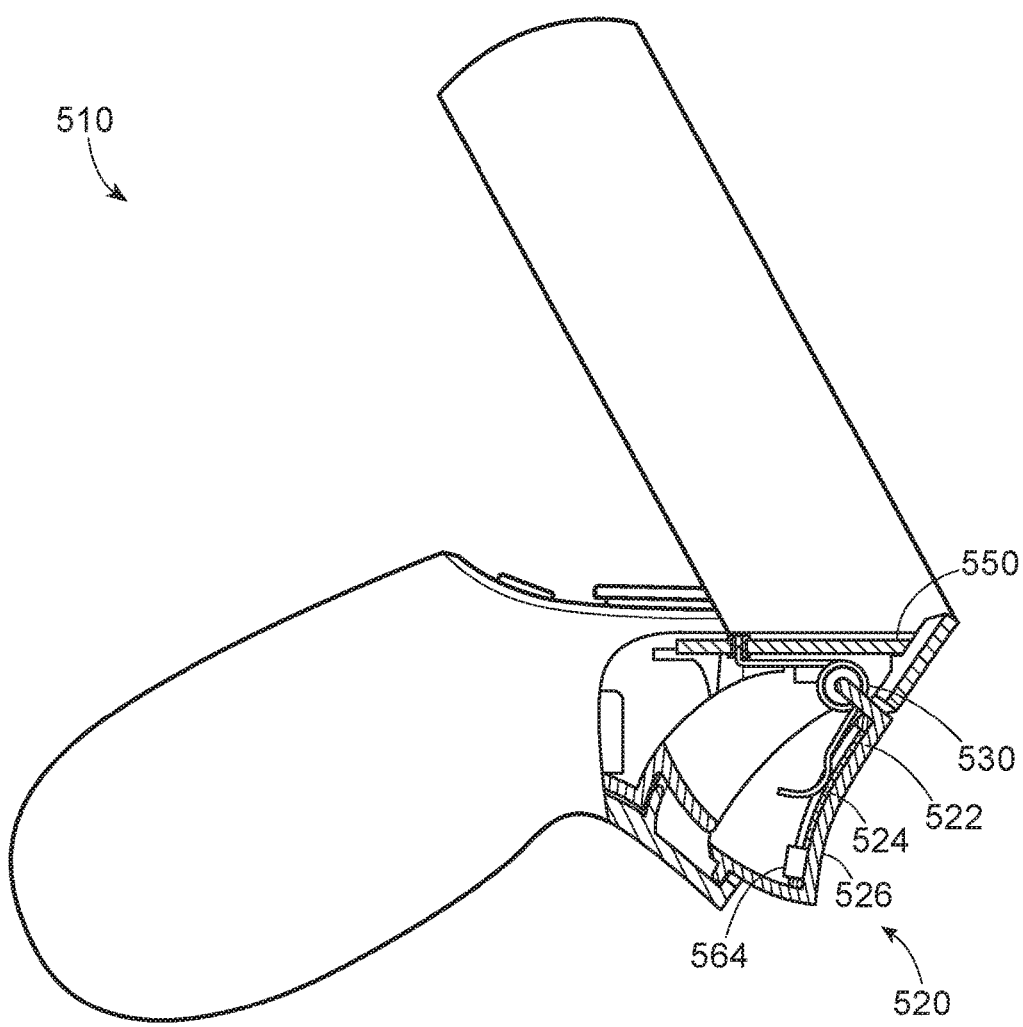
FIG. 12 is a cut-away side view of an exemplary hand-held controller for a head-mounted-display system.

FIG. 12 shows an exemplary hand-held controller 510 for a head-mounted-display system. As shown in FIG. 12, hand-held controller 510 may include a haptic element 564 that provides haptic feedback to a user. Haptic element 564 may include any suitable element or combination of elements providing sensory feedback (e.g., tactile and/or kinesthetic) to a user's hand while using hand-held controller 510. For example, haptic element 564 may include, without limitation, a vibrational motor, an electrostatic element, an acoustic element, an ultrasonic element, and/or an electromagnetic element. Haptic element 564 may, for example, provide tactile and/or kinesthetic feedback to a user, enabling the user to further interact with a virtual environment in a variety of ways.

As illustrated in FIG. 12, hand-held controller 510 may include a PCB 550 that is connected to haptic element 564 via a conductive spring 530 and a conductive electrode 524. Conductive spring 530 may be disposed within trigger 520 between conductive electrode 524 and PCB 550. In some embodiments, haptic element 564 may be positioned adjacent to a portion of trigger housing 522, such as touch surface 526, with which a user interacts. In some embodiments, hand-held controller 510 may include two or more separate conductive electrodes and corresponding separate conductive springs (see, e.g., FIG. 10). For example, hand-held controller 510 may include a first conductive electrode and first conductive spring connected to a first terminal of haptic element 564 and a second conductive electrode and second conductive spring electrically coupled to an opposite second terminal of haptic element 564.

Figure 13:
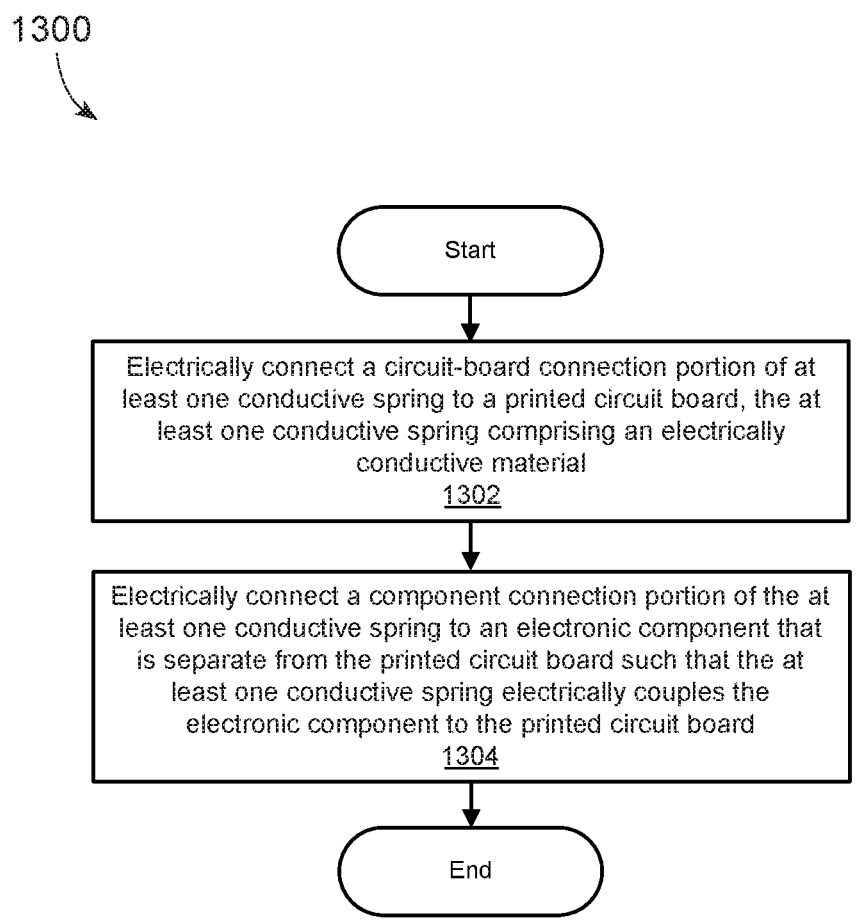
FIG. 13 is a block diagram of an exemplary method for assembling a hand-held controller.

FIG. 13 is a flow diagram of an exemplary method 1300 for manufacturing a hand-held controller for a head-mounted-display system according to any of the embodiments disclosed herein. The steps shown in FIG. 13 may be performed by an individual and/or by any suitable manual and/or automated apparatus.

At step 1302 in FIG. 13, a circuit-board connection portion of at least one conductive spring may be electrically connected to a printed circuit board, the at least one conductive spring including an electrically conductive material. For example, circuit-board connection portion 136 of conductive spring 130 may be electrically connected to PCB 150 (see, e.g., FIGS. 4-8, 10, and 12).

At step 1304 in FIG. 13, a component connection portion of the at least one conductive spring may be electrically connected to an electronic component that is separate from the printed circuit board such that the at least one conductive spring electrically couples the electronic component to the printed circuit board. For example, component connection portion 134 of conductive spring 130 may be electrically connected to capacitive electrode 124 such that conductive spring 130 electrically couples capacitive electrode 124 to PCB 150 (see, e.g., FIGS. 4-8, 10, and 12).

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed to manufacture hand-held controller 110 and/or any other controller disclosed herein. The various exemplary methods described and/or illustrated herein may also omit one or more of the steps described or illustrated herein or include additional steps in addition to those disclosed.

As discussed throughout the instant disclosure, the disclosed methods, systems, and devices may provide one or more advantages over traditional hand-held controllers. For example, the hand-held controllers described herein may include one or more conductive springs for electrically coupling a PCB or other electronic element to an electronic component. In some embodiments, a conductive spring may be disposed between the PCB and an electronic component, such as a capacitive electrode and/or a haptic feedback element, located within a button housing (e.g., a trigger housing) of a hand-held controller. The conductive spring may exert an outward force on the button housing, allowing the button housing to be depressed under an applied force from a user's hand and returning the button housing to an extended position when released by the user. Additionally, the conductive spring may provide an electrical pathway between the PCB and the electronic component, thus eliminating the need to use additional electrical wiring to connect the PCB to the electronic component. Accordingly, the weight of the hand-held controller may be minimized by eliminating the need for additional electrical connectors. Additionally, the cost for manufacturing the hand-held controller may be minimized by reducing the number of parts required in the hand-held controller. The durability of the hand-held controller may also be increased by reducing the overall complexity and number of potential points of failure. In general, the assemblies and systems disclosed herein may improve immersion and/or enjoyment of using a head-mounted display, making virtual- and augmented-reality experiences more fulfilling or useful.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind." Unless otherwise noted, the terms "connected to," "coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. A hand-held controller comprising:
a printed circuit board;
an electronic component that is separate from the printed circuit board, the electronic component comprising:
an electrode having an electrode surface; and
an insulating member covering a covered portion of the electrode surface, the insulating member defining a channel over an exposed portion of the electrode surface; and
at least one conductive torsion spring comprising:
a circuit-board connection portion electrically coupled to the printed circuit board; and
a component connection portion electrically coupled to the electronic component, the at least one conductive torsion spring comprising an electrically conductive material that electrically couples the electronic component to the printed circuit board, wherein the component connection portion is at least partially disposed within the channel so that the component connection portion is slidable within the channel and along the exposed portion of the electrode surface to maintain an electrical coupling between the component connection portion and the electrode throughout a range of motion of the electronic component.

2. The hand-held controller of claim 1, further comprising a button housing, wherein the electronic component is disposed within the button housing.

3. The hand-held controller of claim 2, wherein:
the button housing is movable between an extended position and a depressed position; and
the circuit-board connection portion of the at least one conductive torsion spring is disposed closer to the component connection portion of the at least one conductive torsion spring when the button housing is in the depressed position than when the button housing is in the extended position.

4. The hand-held controller of claim 3, wherein the button housing is biased toward the extended position by the at least one conductive torsion spring.

5. The hand-held controller of claim 2, wherein the button housing is rotatable about a pivot member.

6. The hand-held controller of claim 5, wherein the at least one conductive torsion spring further comprises a coiled portion surrounding part of the pivot member.

7. The hand-held controller of claim 2, wherein the electrode comprises a capacitive electrode disposed along an inner surface portion of the button housing.

8. The hand-held controller of claim 7, wherein the button housing comprises an insulated wall adjacent the capacitive electrode.

9. The hand-held controller of claim 1, wherein the at least one conductive torsion spring further comprises:
a coiled portion;
a circuit-board-side protruding portion extending between the coiled portion and the circuit-board connection portion; and
a component-side protruding portion extending between the coiled portion and the component connection portion such that the component-side protruding portion is not disposed within the channel.

10. The hand-held controller of claim 1, wherein the component connection portion comprises an arcuate region that contacts the exposed portion of the electrode surface within the channel.

11. The hand-held controller of claim 10, wherein the arcuate region of the component connection portion is slidable within the channel and along the exposed portion of the electrode surface.

12. The hand-held controller of claim 10, wherein the arcuate region of the component connection portion is partially disposed within the channel such that at least part of the arcuate region protrudes from the channel.

13. The hand-held controller of claim 1, wherein the at least one conductive torsion spring comprises two conductive torsion springs that are separated from each other by an insulated barrier.

14. The hand-held controller of claim 1, wherein the at least one conductive torsion spring is disposed between the printed circuit board and the electronic component.

15. A head-mounted-display system comprising:
a head-mounted display;
at least one hand-held controller comprising:
a printed circuit board;
an electronic component that is separate from the printed circuit board, the electronic component comprising:
an electrode having an electrode surface; and
an insulating member covering a covered portion of the electrode surface, the insulating member defining a channel over an exposed portion of the electrode surface; and
at least one conductive torsion spring comprising:
a circuit-board connection portion electrically coupled to the printed circuit board; and
a component connection portion electrically coupled to the electronic component, the at least one conductive torsion spring comprising an electrically conductive material that electrically couples the electronic component to the printed circuit board, wherein the component connection portion is at least partially disposed within the channel so that the component connection portion is slidable within the channel and along the exposed portion of the electrode surface to maintain an electrical coupling between the component connection portion and the electrode throughout a range of motion of the electronic component.

16. The head-mounted-display system of claim 15, wherein:
the at least one hand-held controller further comprises a button housing; and
the electronic component is disposed within the button housing.

17. The head-mounted-display system of claim 16, wherein:
the button housing is movable between an extended position and a depressed position; and
the circuit-board connection portion of the at least one conductive torsion spring is disposed closer to the component connection portion of the at least one conductive torsion spring when the button housing is in the depressed position than when the button housing is in the extended position.

18. The head-mounted-display system of claim 15, wherein the at least one conductive torsion spring further comprises:
- a coiled portion;
- a circuit-board-side protruding portion extending between the coiled portion and the circuit-board connection portion; and
- a component-side protruding portion extending between the coiled portion and the component connection portion such that the component-side protruding portion is not disposed within the channel.

19. The head-mounted-display system of claim 15, wherein the component connection portion comprises an arcuate region that contacts the exposed portion of the electrode surface within the channel.

20. A method comprising:
- electrically connecting a circuit-board connection portion of at least one conductive torsion spring to a printed circuit board, the at least one conductive torsion spring comprising an electrically conductive material; and
- electrically connecting a component connection portion of the at least one conductive torsion spring to an electronic component that is separate from the printed circuit board such that the at least one conductive torsion spring electrically couples the electronic component to the printed circuit board, the electronic component comprising:
  - an electrode having an electrode surface; and
  - an insulating member covering a covered portion of the electrode surface, the insulating member defining a channel over an exposed portion of the electrode surface, wherein the component connection portion is at least partially disposed within the channel so that the component connection portion is slidable within the channel and along the exposed portion of the electrode surface to maintain an electrical coupling between the component connection portion and the electrode throughout a range of motion of the electronic component.

* * * * *